United States Patent
Park et al.

[19]

[11] Patent Number: 6,114,208
[45] Date of Patent: Sep. 5, 2000

[54] METHOD FOR FABRICATING COMPLEMENTARY MOS TRANSISTOR

[75] Inventors: Seung-Jin Park, Seoul; Ji-Hyoung Yoo, Suwon, both of Rep. of Korea

[73] Assignee: Samsun Electronics, Co., Ltd., Suwon, Rep. of Korea

[21] Appl. No.: 09/007,022

[22] Filed: Jan. 14, 1998

[30] Foreign Application Priority Data

Jan. 15, 1997 [KR] Rep. of Korea .................. 97-1048

[51] Int. Cl.[7] .................................................. H01L 21/225
[52] U.S. Cl. ........................ 438/300; 438/304; 438/368
[58] Field of Search ................................. 438/142, 197, 438/199, 227, 228, 288, 300, 900, 364, 368, 249, 304; 257/57, 66

[56] References Cited

U.S. PATENT DOCUMENTS

| | | | |
|---|---|---|---|
| 4,546,535 | 10/1985 | Shepard | 29/571 |
| 4,764,481 | 8/1988 | Alvi et al. | 438/227 |
| 5,196,357 | 3/1993 | Boardman et al. | 438/304 |
| 5,270,232 | 12/1993 | Kimura et al. | 438/304 |
| 5,545,579 | 8/1996 | Liang et al. | 438/291 |
| 5,696,016 | 12/1997 | Chen et al. | 438/199 |
| 5,904,516 | 5/1999 | Park | 438/197 |

*Primary Examiner*—John F. Niebling
*Assistant Examiner*—Christopher Lattin
*Attorney, Agent, or Firm*—Marger Johnson & McCollom, P.C.

[57] ABSTRACT

A method for fabricating complementary metal-oxide-semiconductor (CMOS) devices and circuits resulting therefrom are provided. The method includes forming the source and drain regions of the CMOS device by out-diffusion of ions injected into a conductive spacer. The method also includes forming the gate electrode after the source and drain regions have been activated by heat treatment. By forming the gate electrode after heat treating the source and drain regions, the material used to form the gate electrode is not distorted due to heat.

13 Claims, 9 Drawing Sheets

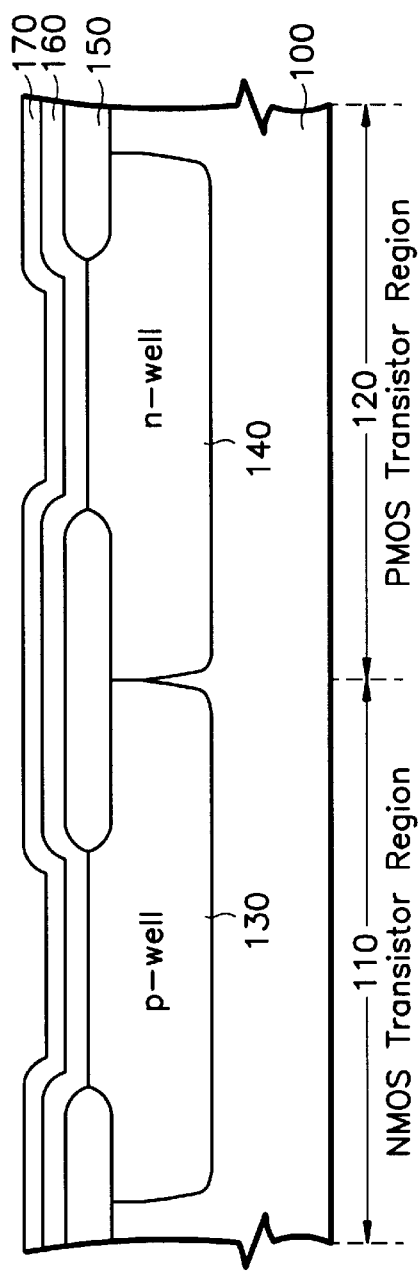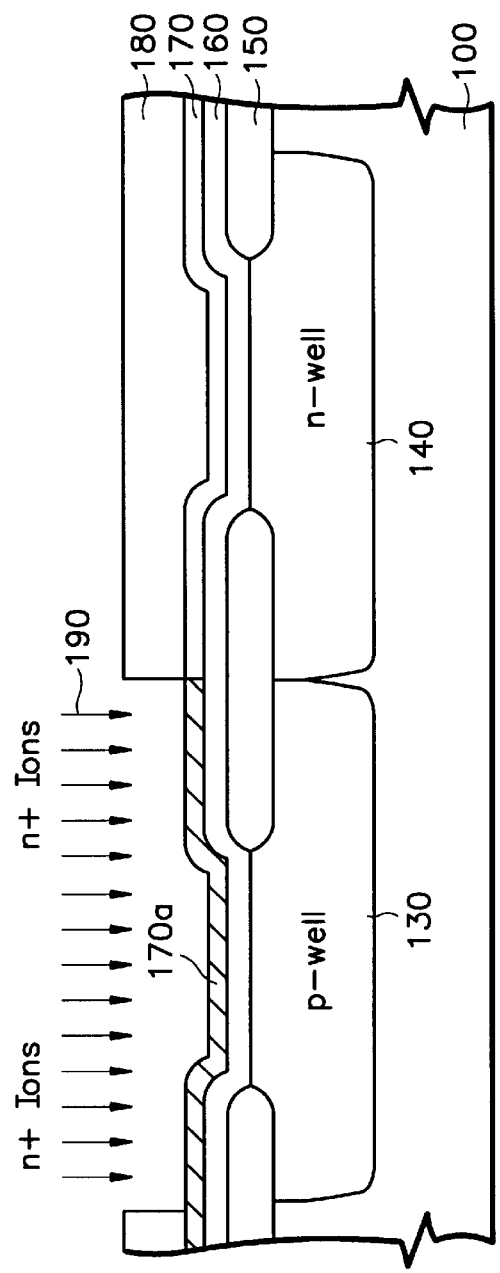

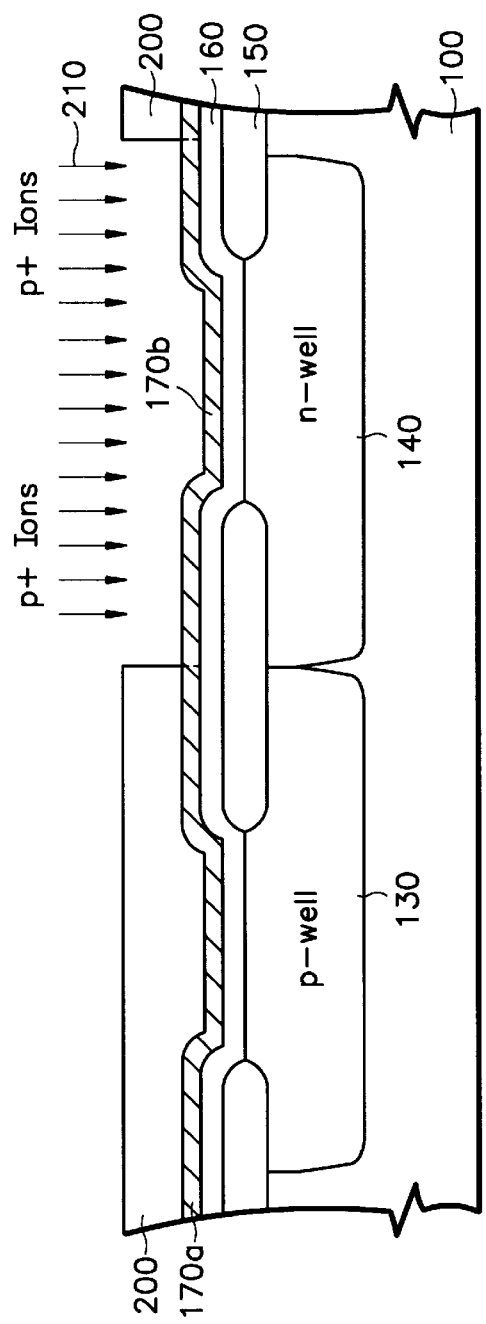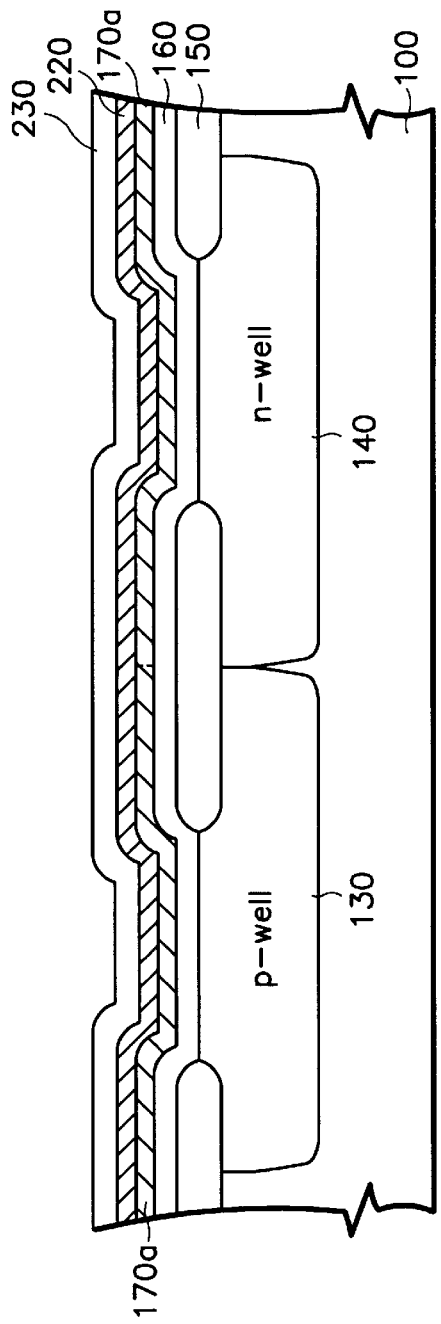

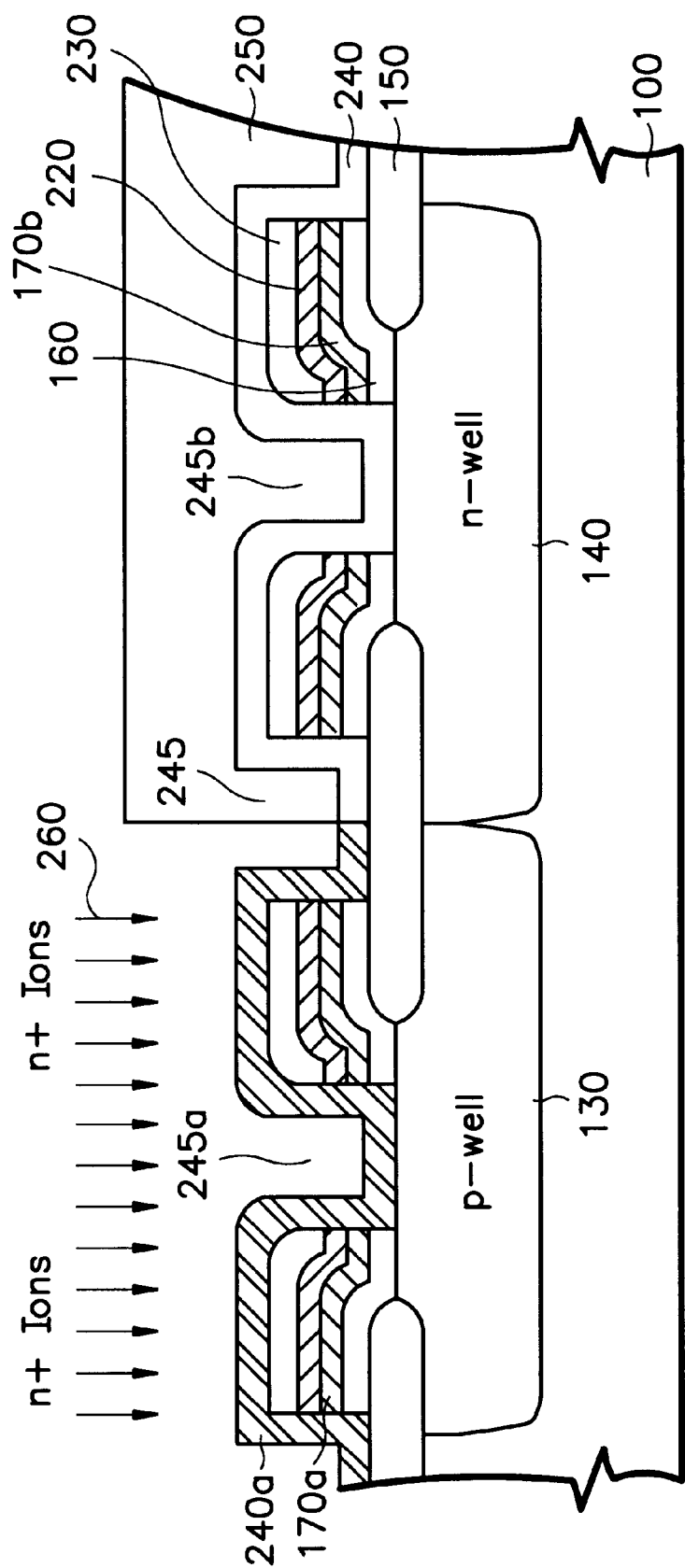

METHOD FOR FABRICATING COMPLEMENTARY MOS TRANSISTOR

FIELD OF THE INVENTION

The present invention relates to semiconductor devices and, more particularly, to a method for fabricating complementary MOS devices and circuits resulting therefrom.

BACKGROUND OF THE INVENTION

As integrated circuits have become more complex, the individual devices or integrated circuits, such as complementary metal oxide semiconductor (MOS) transistors, have become smaller and are more densely packed. Simply shrinking device dimensions is not sufficient to permit the increased complexity of the new circuits. New processing technologies and innovative devices are also required.

FIG. 1 shows a vertical structure of a prior art complementary MOS (CMOS) device having an n-channel and a p-channel MOS transistor. In FIG. 1, p-well region 40 and n-well region 50 are formed on a semiconductor substrate 10 to define p-channel and n-channel MOS transistors 20 and 30. Field oxide layer 60 is formed on the semiconductor substrate 10 to define active and inactive regions. Gate structures 70 and 80 are formed on the active regions of the p-channel and n-channel MOS transistors 20 and 30, respectively. Although the p-channel and n-channel devices 20 and 30, respectively, include a gate oxide layer, the gate oxide layer of gate structures 70 and 80 is not shown for reasons of clarity. Source and drain regions 90$a$ and 100$a$ of the n-channel MOS transistor are formed in the well region 40. Likewise, source and drain regions 90$b$ and 100$b$ of the p-channel MOS transistor are formed by injecting impurity ions in the well region 50.

In the prior art CMOS device structure, the channel length of each of the MOS transistors can be reduced. However, it is difficult to reduce the width of each of the source/drain regions because each of the source/drain regions are formed by impurity injection through windows. The source/drain regions of each transistor is formed by depositing a masking layer over the transistor, patterning the masking layer to form windows which expose portions of the source/drain regions, and then injecting impurity ions through the windows. A large width source/drain region results in increased junction capacitance which adversely affects the CMOS device's high speed operating characteristics.

If, however, the width of the source/drain region is shortened to improve the device's high-speed operating characteristics, it is difficult to sufficiently ensure large enough contact regions CNT for providing electrical contact between a source/drain electrode and the underlying source/drain region as shown in FIG. 2. All of the contact regions CNT are formed within the active region 55. The active region 55 is indicated by the dotted line shown in FIG. 2. Also, shown in FIG. 2 is the channel width Lg.

Moreover, after the formation of the gate electrode, a heat treatment process is performed on the device to activate impurity ions of the source/drain region preventing high-conductivity materials such as metal or the like used to form the gate electrode.

Accordingly, a need remains for a CMOS device and a method of fabricating CMOS device which reduces junction capacitance while improving high speed operating characteristics and ensuring adequate electrical contact between electrodes and the underlying source/drain regions.

SUMMARY OF THE INVENTION

The present invention overcomes the problems associated with prior art CMOS devices and methods for fabricating the same. It is an object of the present invention to provide a complementary MOS transistor with reduced junction capacitance which improves the operating speed thereof and a method for fabricating the same.

It is another object of the present invention to provide a complementary MOS transistor having a gate electrode formed of a high-conductivity material and a method for fabricating the same.

According to one embodiment, the present invention provides a method for fabricating a complementary MOS device having a first MOS transistor and a second MOS transistor. The method comprises forming well regions of first and second conductivity types n a semiconductor substrate and forming a field oxide layer on the substrate. The method further comprises fabricating first and second source/drain electrode structures on said regions of first and second conductivity types. The first and second MOS transistors forming in the regions of first and second conductivity types, respectively. The method further includes forming first and second spacers on both side walls of said first source/drain electrode structure, said first spacer being doped with impurity ions of the second conductivity type and said second spacer being doped with impurity ions of the first conductivity type and oxidizing surfaces of said regions of first and second conductivity types at a predetermined temperature to form gate oxide layers on the surfaces of the spacers and at the same time to form source/drain regions of first and second conductivity types by out-diffusion of the impurity ions doped in the first and second spacers toward said well regions during the oxidation. Finally, the method includes forming source/drain electrodes on said first and second source/drain electrode structures via contact holes therein and forming gate electrodes on the gate oxide layers.

According to another embodiment, the present invention provides a CMOS device having MOS transistors of first and second channel types. The MOS transistor well regions are formed on a semiconductor substrate. The CMOS device comprises a field oxide layer formed on the substrate to define active and inactive regions in each of the MOS transistors of first and second channel types; a source/drain region formed in each active region of the MOS transistors; a source/drain electrode structure formed on each of the well regions; a spacer formed on both side walls of the source/drain electrode structure, said spacer being electrically connected to the source/drain region; a source/drain electrode formed on the source/drain electrode structure via a contact hole therein; and a gate electrode formed on the well region and in the active region.

The foregoing and other objects, features, and advantages of the invention will become more readily apparent from the following detailed description of a preferred embodiment of the invention which proceeds with reference to the accompanying drawings.

BRIEF DESCRIPTION OF THE DRAWINGS

FIGS. 5A through 5J are flow diagrams showing by cross-sectional representation the process steps of a method for fabricating a CMOS device according to the present invention.

DETAILED DESCRIPTION OF PREFERRED EMBODIMENTS

Figure 3:
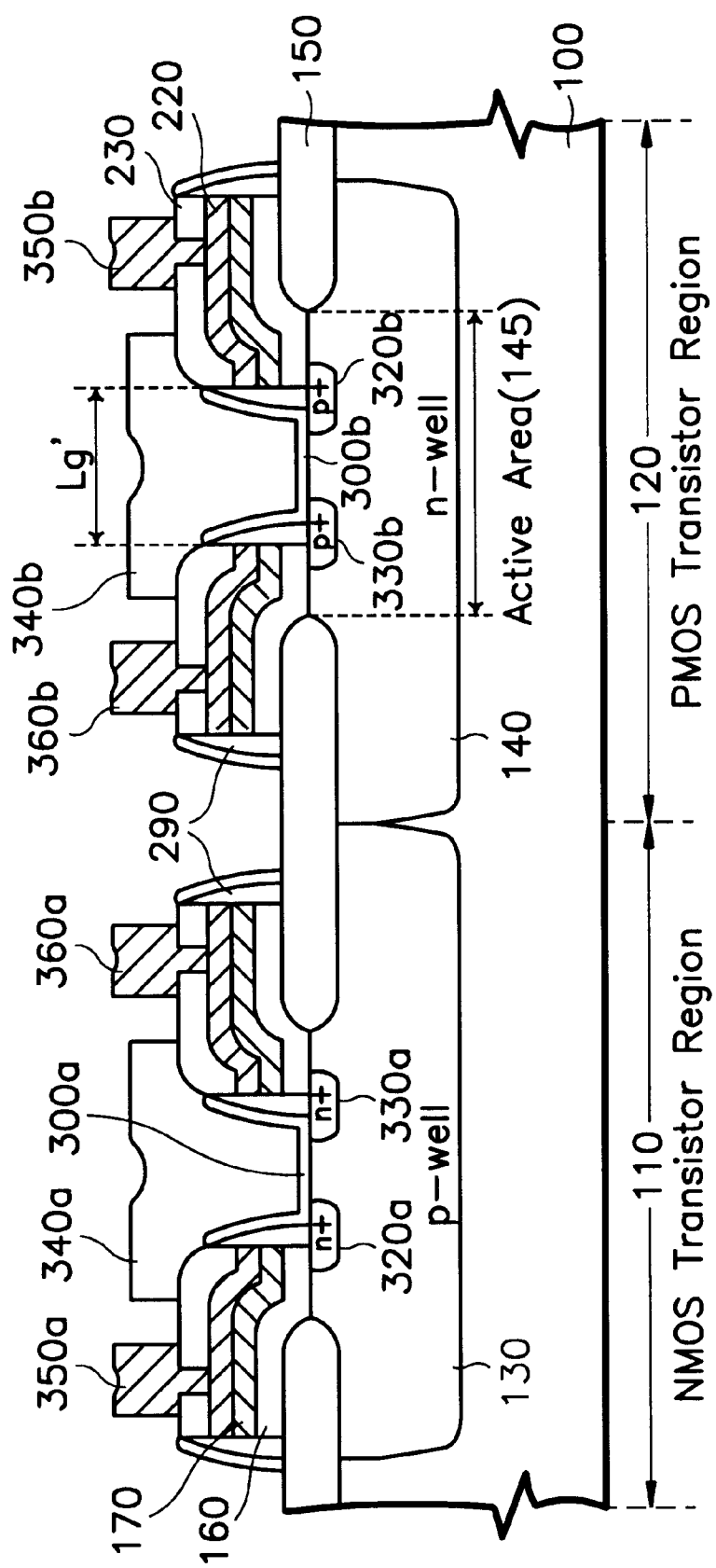
FIG. 3 is a diagram showing the vertical structure of a CMOS device according to the present invention.
Figure 4:
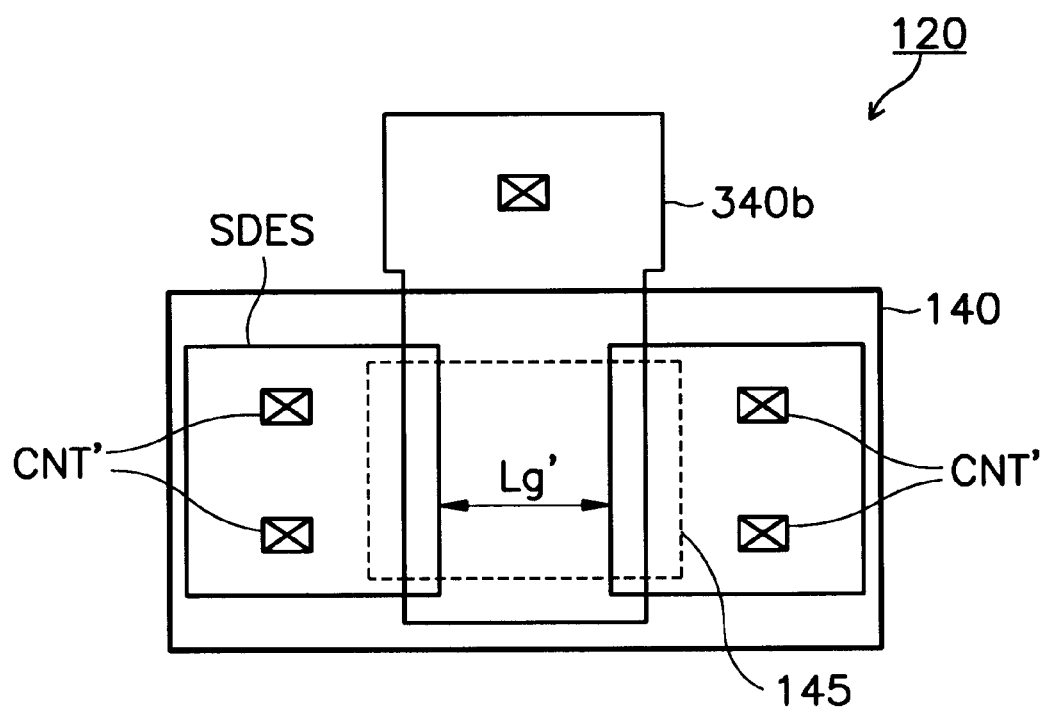
FIG. 4 is a diagram showing the layout of the CMOS device shown in FIG. 3.

FIG. 3 shows the vertical structure of a complementary MOS (CMOS) device according to the present invention and FIG. 4 shows the layout of the CMOS device.

The CMOS device shown in FIG. 3 comprises at least one p-channel MOS (PMOS) transistor and at least one n-channel MOS (NMOS) transistor. Each MOS transistor has a source/drain electrode electrically connected with a source/drain region via a source/drain electrode structure. The following describes the NMOS transistor structure as an example. It is obvious to a person skilled in the art how to modify the NMOS transistor structure to create a PMOS transistor. The NMOS transistor will be described as an example. The source and drain regions 320a and 330a, respectively, are formed in a p-well region 130 of the NMOS transistor. A part of the source/drain electrode structure is formed on the p-well region 130. A conductive spacer 290 is formed on both side walls of the source/drain electrode structure and on the source and drain regions 320a and 330a, respectively. Source and drain electrodes 350a and 360a, respectively, are formed on the source/drain electrode structure via contact holes therein (not shown).

The source/drain electrode structure comprises a lower low-temperature oxide (LTO) layer 160 formed on a substrate 100, a doped polysilicon layer 170 formed on the lower LTO layer 160, a silicide layer 220 formed on the doped polysilicon layer 170, and a top LTO layer 230 formed on the silicide layer 220.

As shown in FIG. 4, the contact holes CNT are formed outside the active region 145 indicated by a dotted line and on the source/drain electrode structure SDES. The source and drain electrodes 350a and 360a, respectively, are formed on the source/drain electrode structure SDES. By doing so, sufficient contact region for allowing the source and drain electrodes to be electrically connected to the source and drain regions, respectively, is easily achieved.

A method for fabricating a CMOS transistor is described with reference to FIGS. 5A through 5J.

Referring to FIG. 5A, the CMOS device includes substrate 100, p-well region 130, n-well region 140, field oxide region 150, LTO layer 160, and polysilicon layer 170. The substrate is defined by two broad regions: n-channel MOS (NMOS) transistor region 110 and PMOS (p-channel MOS) transistor region 120. The p-well and n-well regions 130 and 140, respectively, are formed in the NMOS and PMOS transistor regions 110 and 120, respectively, of the substrate 100. The field oxide region 150 is formed on an interface surface between the p-well and n-well regions 130 and 140 for electrically isolating the NMOS and PMOS transistor regions 110 and 120, respectively.

Thereafter, the LTO layer 160 and the polysilicon layer 170 are sequentially formed over the substrate, including the field oxide region 150. The LTO layer 160 preferably has a thickness between 500 Å to 100 Å and the polysilicon layer 170 preferably has a thickness between 3000 Å to 4000 Å. The polysilicon layer 170 is not doped with impurity ions.

As shown in FIG. 5B, the polysilicon layer 170 corresponding to NMOS transistor region 110 is exposed to ion injection while the polysilicon layer 170 corresponding to PMOS transistor region 120 is masked using photoresist pattern 180. Photoresist pattern 180 is formed by well known photolithographic technology and will not be described in further detail.

The NMOS transistor region 110 is then injected with n+ type impurity ions using the photoresist pattern 180 as an ion injection mask over the PMOS transistor region 120. The exposed part of the polysilicon layer 170 is doped with the n+ impurity ions 190 thereby forming an n+ type polysilicon layer 170a in the NMOS transistor region 110.

Similarly, as shown in FIG. 5C, the polysilicon layer 170 corresponding to PMOS transistor region 120 is exposed to ion injection while the polysilicon layer 170 corresponding to NMOS transistor region 110 is masked using photoresist pattern 200.

The PMOS transistor region 120 is then injected with p+ type impurity ions using the photoresist pattern 200 as an ion injection mask. The exposed part of the polysilicon layer 170 is doped with the p+ impurity ions 210 thereby forming a p+ type polysilicon layer 170b in the PMOS transistor region 120.

Referring to FIG. 5D, a silicide layer 220 is formed over the doped polysilicon layers 170a and 170b using a silicidation process. Next, an LTO layer 230 is formed on the silicide layer 220.

Subsequently, as shown in FIG. 5E, the LTO layer 230, the silicide layer 220, the doped polysilicon layers 170a and 170b, and the LTO layer 160 are sequentially removed using an etching process. The etching process is performed until a part of the field oxide region 150 and parts of the well regions 130 and 140 are exposed forming openings 245. The source/drain electrode layers of the NMOS and PMOS transistors are formed over the openings 245. Next, an undoped polysilicon layer 240 is deposited over the substrate including the openings 245. A photoresist pattern 250 is formed over the PMOS transistor region 120 and the exposed part of the polysilicon layer 240 corresponding to the NMOS transistor region 110 is injected with n+ type impurity ions using the photoresist pattern 250 as an ion injection mask. The exposed part of the polysilicon layer 240 is doped with the n+ impurity ions 260 thereby forming an n+ type polysilicon layer 240a in the NMOS transistor region 110. The openings 245a and 245b form the gate regions of the NMOS and PMOS transistor regions, respectively.

Since the doped polysilicon layers 170a and 170b and the silicide layer 220 constitute a source/drain electrode structure, a contact hole in the silicide layer 220 for electrically connecting the source/drain electrode structure with a conductive source/drain electrode is easily formed. This is because the source/drain electrode structure is formed outside the active region 145, as shown in FIG. 4, and has a sufficiently large width to form the contact hole for electrically connecting with the conductive source/drain electrode. The source/drain electrode is preferably made of a conductive material such as a metal.

Figure 5F:
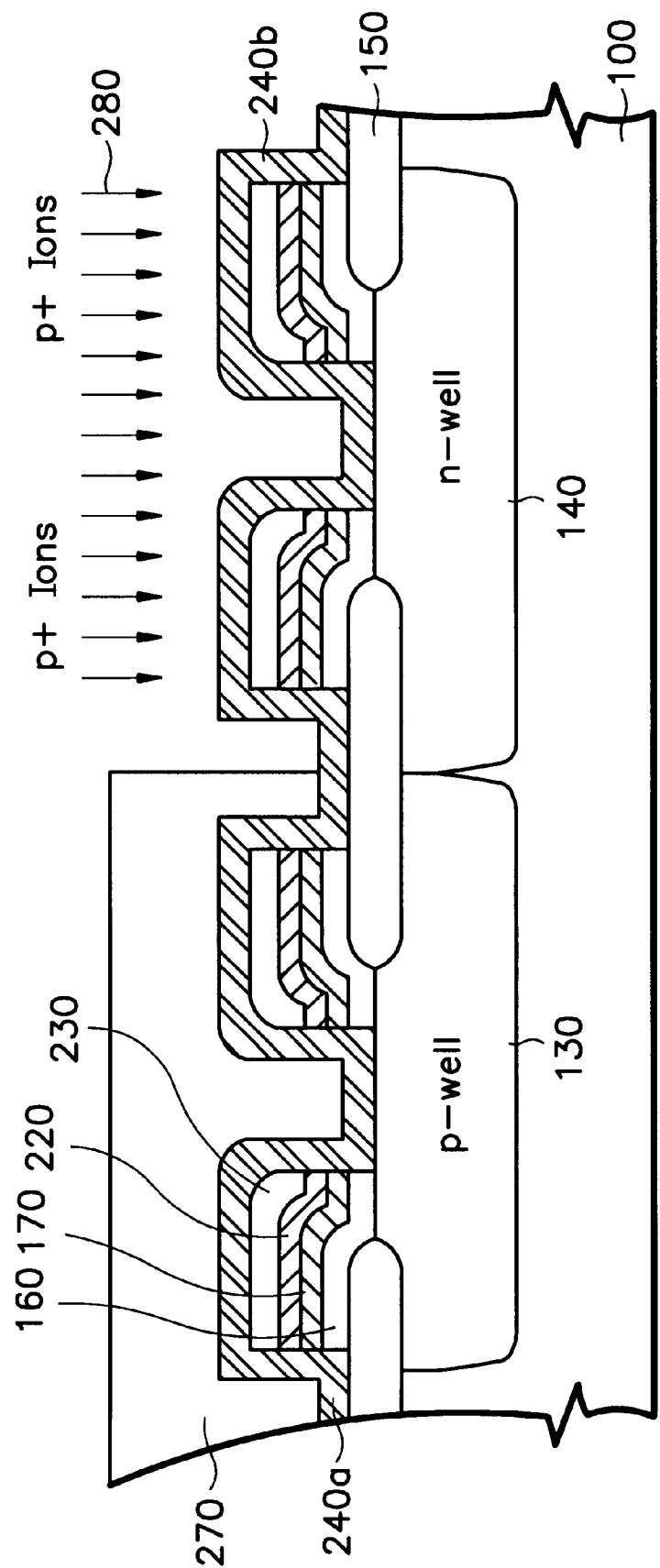

Similarly, as show in FIG. 5F, a photoresist pattern 270 is formed over the NMOS transistor region 110. The exposed part of the polysilicon layer 240 corresponding to the PMOS transistor region 120 is injected with p+ type impurity ions using the photoresist pattern 270 as an ion injection mask. The exposed part of the polysilicon layer 240 is doped with the p+ impurity ions 280 thereby forming a p+ type polysilicon layer 240b in the PMOS transistor region 120.

Figure 5G:
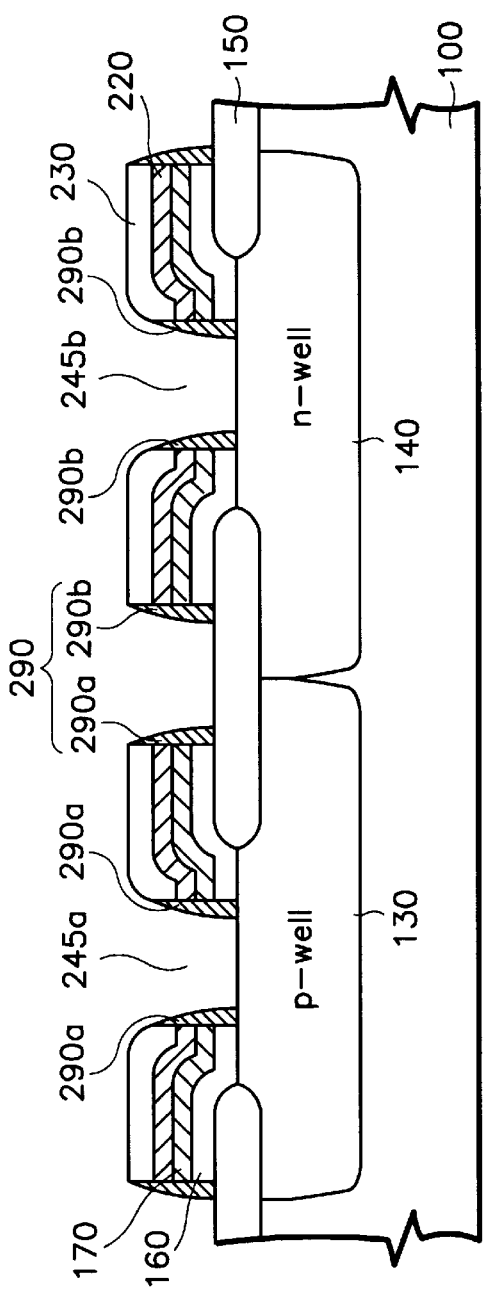

With reference to FIG. 5G, an etch-back process of the doped polysilicon layers 240a and 240b is carried out so that a spacer 290 is formed on both side walls of the source/drain electrode layer. Spacer 290 consists of n+ spacer 290a and p+ spacer 290b.

Figure 5H:
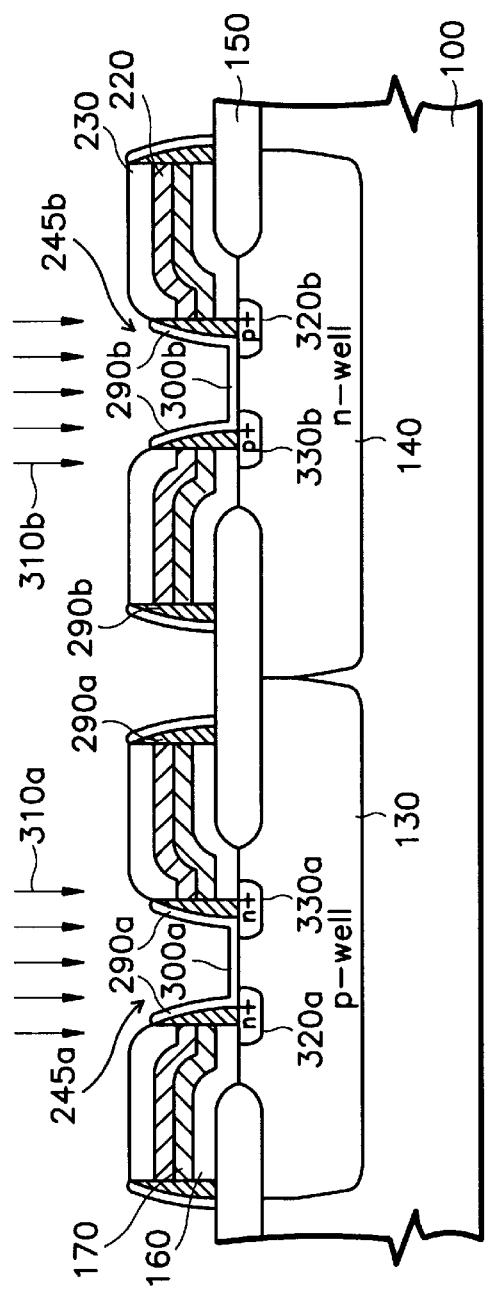

As shown in FIG. 5H, the spacer 290 and the exposed surfaces of the well regions 130 and 140 are simultaneously oxidized using a high temperature oxidation process. During the oxidation process, the doped polysilicon spacer 290 is changed into an insulating spacer 290a and a gate insulating layer 300a is formed on the well region and on the insulating spacer 290a. Gate insulating layer 300a is formed at the gate region 245a of the NMOS transistor region 110 and gate insulating layer 300b is formed at the gate region 245b of the PMOS transistor region 120. Since the gate insulating layer is grown thicker at the doped polysilicon spacer 290 than at the silicon surface of the well region, a gate electrode is electrically insulated from a source/drain electrode.

During the high temperature oxidation process, the n+ impurity ions previously injected in the spacer 290a are out-diffused into the p-well region 130 forming n+ type source/drain regions 320a and 330a, respectively. Similarly the p+ impurity ions previously injected in the spacer 290b are out-diffused into the n-well region 140 to form p+ type source/drain regions 320b and 330b, respectively. The source/drain regions 320a, 330a, 320b, and 330b are shown in FIG. 5H.

Of significant importance to the invention, the source/drain regions 320a, 330a, 320b, and 330b are formed by out-diffusion of the impurity ions from the spacer 290 to the corresponding well region. By forming the source/drain regions in this manner, the width of the source/drain region is greatly reduced because the width of the source/drain region is determined by the bottom width of the spacer 290.

Referring again to FIG. 5H, n-type impurity ions 310a are injected into the p-well region 130 between the source/drain regions 320a and 330a to form an n-channel of the NMOS transistor region 110. Similarly, p-type impurity ions 310b are injected into the n-well region 140 between the source/drain regions 320b and 330b to form a p-channel of the PMOS transistor region 1220.

Figure 5I:
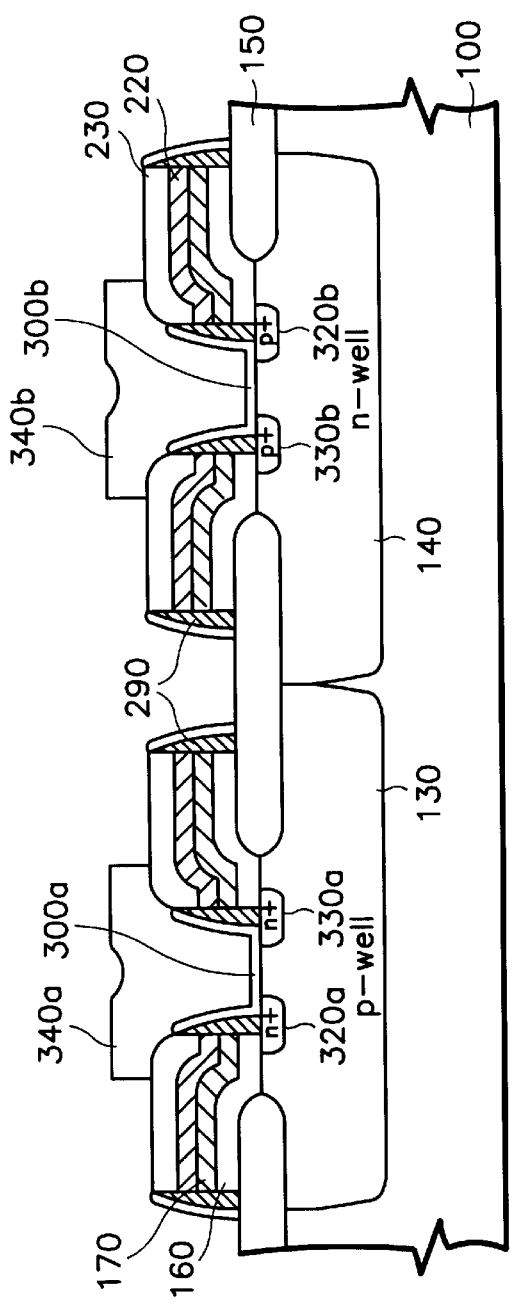

A gate electrode pattern s formed on the gate insulating layer 300a and 300b as shown in FIG. 5I. For example, a gate electrode layer 340a is formed on the gate insulating layer 300a and a gate electrode layer 340b is formed on the gate insulating layer 300b. Thus, the gate electrode pattern is formed after the heat treatment necessary for activating the source/drain regions. By doing so, a conductor, such as a conductive polysilicon layer, a metal layer, or the like can be used as the gate electrode pattern. Conventionally, the gate electrode pattern is formed before the heat treatment necessary for activating the source/drain regions which results in distorting the gate electrode pattern material being distorted during the heat treatment. As a result, the distortion of the gate electrode can be prevented.

Figure 5J:
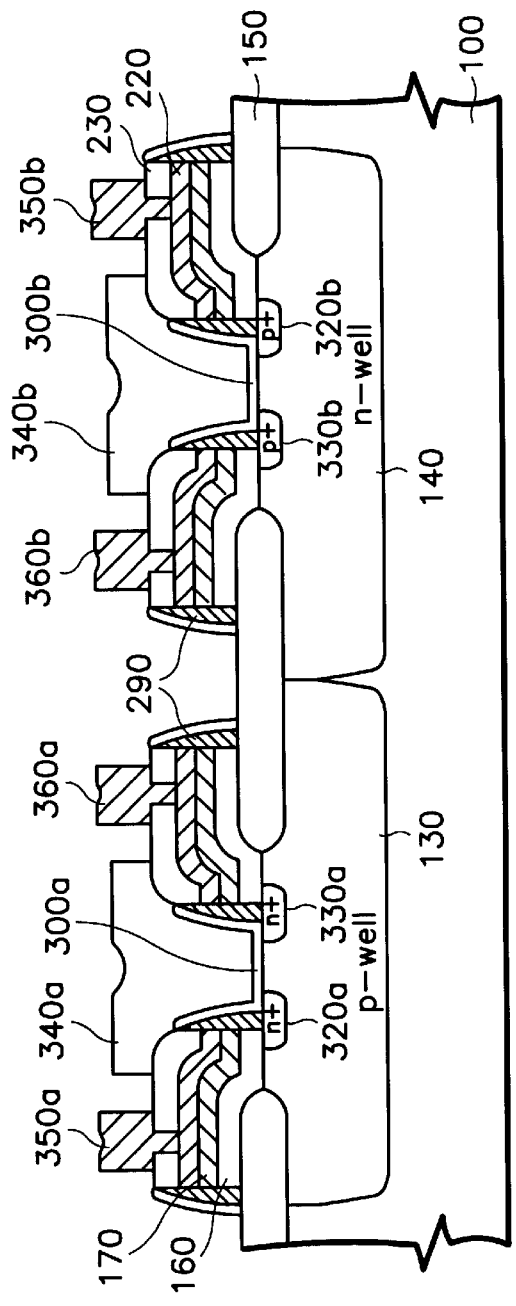

Finally, the source/drain electrodes 350a, 360a, 350b, and 360b are formed on the silicide layer 220 via the contact hole of LTO layer 230 a shown in FIG. 5J. The LTO layer 230 is selectively removed by a well known etching process using a via-hole forming mask such that contact holes are formed on the silicide layer 220 corresponding to the source/drain electrodes. Next, a conductive material is deposited over the substrate, filling the contact holes. The conductive material is then patterned resulting in the source/drain electrodes 350a, 360a, 350b, and 360b of the NMOS and PMOS transistor regions 110 and 120, respectively.

Figure 1:
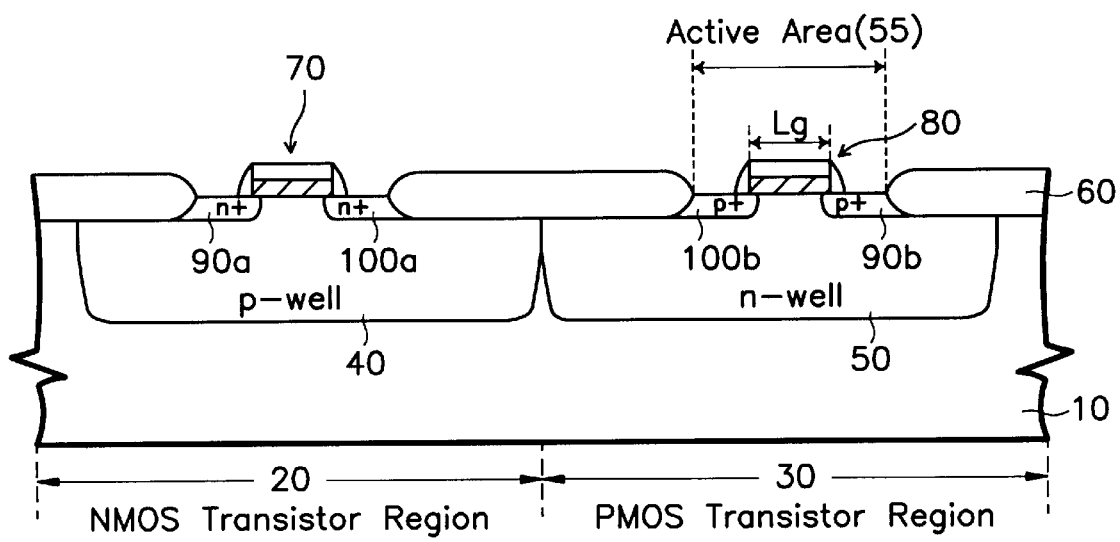
FIG. 1 is a diagram showing the vertical structure of a prior art CMOS device.
Figure 2:
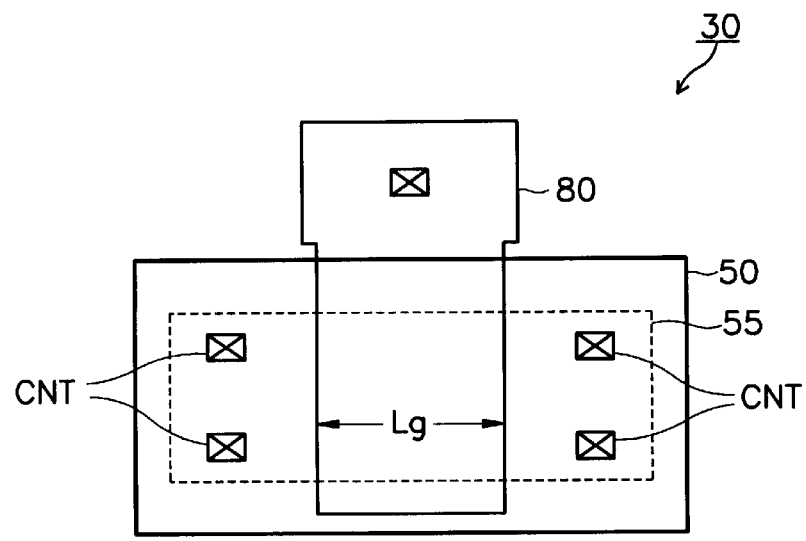
FIG. 2 is a diagram showing the layout of the CMOS device shown in FIG. 1.

Because the source/drain regions may be formed by out-diffusion of impurity ions from a spacer into a well region, the width of each source/drain region is determined according to the bottom width of the spacer formed on both side walls of the source/drain electrode layer. Thus, the area of each of the source/drain regions is greatly reduced compared to the conventional CMOS transistor shown in FIG. 1 thereby reducing the junction capacitance of the CMOS transistor. Accordingly, the CMOS transistor of the present invention has improved high-speed operating characteristics.

Moreover, because the gate electrodes of the CMOS transistor are formed after all of the process steps involving thermal treatment are completed, a high-conductivity material such as a metal or the like, can be used as a gate electrode.

Having described and illustrated the principles of the invention in a preferred embodiment thereof, it should be apparent that the invention can be modified in arrangement and detail without departing from such principles. I claim all modification and variations coming within the spirit and scope of the following claims.

What is claimed is:

1. A method for fabricating a complementary MOS device having a first and second MOS transistors, comprising:

forming well regions of first and second conductivity types on a semiconductor substrate, the first and second MOS transistors respectively formed on the well regions of the first and second conductivity types;

forming a field oxide layer on the substrate;

forming first and second source/drain electrode structures on the well regions of first and second conductivity types, respectively;

forming a first spacer on both side walls of the first source/drain electrode structure, the first spacer being doped with impurity ions of the second conductivity type;

forming a second spacer on both side walls of the second source/drain electrode structure, the second spacer being doped with impurity ions of the first conductivity type;

forming first and second gate oxide layers on the well regions of first and second conductivity type by oxidizing surfaces of the spacers at a predetermined temperature;

forming source/drain electrodes n the first and second source/drain electrode structures; and forming gate electrodes on the first and second gate oxide layers;

wherein forming the first and second source/drain electrode structures includes:
       forming a first insulating layer on the substrate;
       forming a first conductive layer on the first insulating layer;
       forming a second conductive layer on the first conductive layer; and
       forming a second insulating layer on the second conductive layer.

2. The method of claim 1 wherein forming the first insulating layer includes forming a first low temperature oxide layer and forming the second insulating layer includes forming a second low temperature oxide layer.

3. The method of claim 1 wherein forming the first conductive layer includes forming a doped polysilicon layer and forming the second conductive layer includes forming a silicide layer.

4. The method of claim 3 wherein forming the doped polysilicon layer includes:
   forming an undoped polysilicon layer on the first insulating layer; and
   injecting impurity ions into the undoped polysilicon layer.

5. The method of claim 1 wherein forming the first insulating layer includes forming the first insulating layer with a thickness of approximately 500 Å to 1000 Å and forming the first conductive layer includes forming a first conductive layer with a thickness of approximately 3000 Å to 4000 Å.

6. A method for fabricating a complementary MOS device having a first and second MOS transistors, comprising:

forming well regions of first and second conductivity types on a semiconductor substrate, the first and second MOS transistors respectively formed on the well regions of the first and second conductivity types;

forming a field oxide layer on the substrate;

forming first and second source/drain electrode structures on the well regions of first and second conductivity types, respectively;

forming a first spacer on both side walls of the first source/drain electrode structure, the first spacer being doped with impurity ions of the second conductivity type;

forming a second spacer on both side walls of the second source/drain electrode structure, the second spacer being doped with impurity ions of the first conductivity type;

forming first and second gate oxide layers on the well regions of first and second conductivity type by oxidizing surfaces of the spacers at a predetermined temperature;

forming source/drain electrodes on the first and second source/drain electrode structures; and forming gate electrodes on the first and second gate oxide layers;

wherein forming the first spacer includes forming a first doped polysilicon spacer and forming the second spacer includes forming a second doped polysilicon layer.

7. A method for fabricating a MOS device, comprising:

forming a well region having a first conductivity type on a substrate;

forming a source and a drain electrode structure on the well region;

forming a first spacer on a source electrode structure side wall;

forming a second spacer on a drain electrode structure side wall;

doping the first and second spacers with impurity ions of a second conductivity type;

forming a source region, a drain region, and a gate insulating layer by oxidizing surfaces of the spacers at a predetermined temperature;

forming a source electrode on the source electrode structure;

forming a drain electrode on the drain electrode structure;

forming a gate electrode on the gate insulating layer; and forming a field oxide layer on the substrate.

8. A method for fabricating a MOS device, comprising:

forming a well region having a first conductivity type on a substrate;

forming a source and a drain electrode structure on the well region;

forming a first spacer on a source electrode structure side wall;

forming a second spacer on a drain electrode structure side wall;

doping the first and second spacers with impurity ions of a second conductivity type;

forming a source region, a drain region, and a gate insulating layer by oxidizing surfaces of the spacers at a predetermined temperature;

forming a source electrode on the source electrode structure;

forming a drain electrode on the drain electrode structure; and forming a gate electrode on the gate insulating layer;

wherein forming the source and drain region includes forming a source and drain regions having a second conductivity type by out-diffusing the impurity ions of second conductivity type from the first and second spacers, respectively, to the well region.

9. A method for fabricating a MOS device, comprising:

forming a well region having a first conductivity type on a substrate;

forming a source and a drain electrode structure on the well region;

forming a first spacer on a source electrode structure side wall;

forming a second spacer on a drain electrode structure side wall;

doping the first ad second spacers with impurity ions of a second conductivity type;

forming a source region, a drain region, and a gate insulating layer by oxidizing surfaces of the spacers at a predetermined temperature;

forming a source electrode on the source electrode structure;

forming a drain electrode on the drain electrode structure; and forming a gate electrode on the gate insulating layer;

wherein forming the source and drain electrode structures includes:
  forming a first insulating layer on the substrate;
  forming a first conductive layer on the first insulating layer;
  forming a second conductive layer on the first conductive layer; and
  forming a second insulating layer on the second conductive layer.

10. The method of claim 9 wherein forming the first insulating layer includes forming a first low temperature oxide layer and forming the second insulating layer includes forming a second low temperature oxide layer.

11. The method of claim 10 wherein forming the first conductive layer includes forming a doped polysilicon layer and forming the second conductive layer includes forming a silicide layer.

12. The method of claim 11 wherein forming the first insulating layer includes forming a first insulating layer having a thickness between 500 Å to 1000 Å and forming a first conductive layer includes forming a first conductive layer having a thickness between 3000 Å to 4000 Å.

13. The method of claim 12 wherein forming the first spacer includes forming a first spacer made of doped polysilicon and wherein forming the second spacer includes forming a second spacer made of doped polysilicon.

* * * * *

UNITED STATES PATENT AND TRADEMARK OFFICE
CERTIFICATE OF CORRECTION

PATENT NO. : 6,114,208
DATED : September 5, 2000
INVENTOR(S) : Park et al.

Page 1 of 1

It is certified that error appears in the above-identified patent and that said Letters Patent is hereby corrected as shown below:

Column 2,
Line 13, "n a semiconductor" should read -- in a semiconductor --;

Column 3,
Line 56, "500 Å to 100 Å should read -- 500 Å to 1000 Å --;

Column 5,
Line 34, "pattern s formed" should read -- pattern is formed --;

Column 6,
Line 39, "electrodes n the first" should read -- electrodes in the first --.

Signed and Sealed this

Twenty-sixth Day of February, 2002

Attest:

*Attesting Officer*

JAMES E. ROGAN
*Director of the United States Patent and Trademark Office*